(12) United States Patent
Bageshwar et al.

(10) Patent No.: US 9,645,219 B2
(45) Date of Patent: May 9, 2017

(54) SYSTEMS AND METHODS FOR OFF-LINE AND ON-LINE SENSOR CALIBRATION

(71) Applicant: Honeywell International Inc., Morristown, NJ (US)

(72) Inventors: Vibhor L. Bageshwar, Minneapolis, MN (US); Michael Ray Elgersma, Plymouth, MN (US)

(73) Assignee: Honeywell International Inc., Morris Plains, NJ (US)

( * ) Notice: Subject to any disclaimer, the term of this patent is extended or adjusted under 35 U.S.C. 154(b) by 665 days.

(21) Appl. No.: 14/070,008

(22) Filed: Nov. 1, 2013

(65) Prior Publication Data

US 2015/0127289 A1    May 7, 2015

(51) Int. Cl.
   *G01S 7/497*   (2006.01)
   *G01R 35/00*   (2006.01)
   *G01C 25/00*   (2006.01)
   *G01C 21/00*   (2006.01)
   *G01R 21/00*   (2006.01)

(52) U.S. Cl.
   CPC ............. *G01R 35/00* (2013.01); *G01C 21/00* (2013.01); *G01C 25/00* (2013.01); *G01R 21/006* (2013.01)

(58) Field of Classification Search
   CPC .................................. G01C 25/00; G01R 35/00
   See application file for complete search history.

(56) References Cited

U.S. PATENT DOCUMENTS

| 6,876,926 B2 * | 4/2005 | Kirkland ............... G01C 21/16 244/177 |
| 7,386,395 B1 | 6/2008 | Masson |
| 7,689,357 B2 | 3/2010 | Martin et al. |

OTHER PUBLICATIONS

European Patent Office, "Office Action from EP Application No. 14186870.3 mailed Mar. 19, 2015", "from Foreign Counterpart of U.S. Appl. No. 14/070,008", Mar. 19, 2015, pp. 1-6, Published in: EP.
Ning et al., "On the Geometry of Covariance Matrices", "IEEE Signal Processing Letters", Jun. 13, 2013, pp. 787-790, vol. 20, No. 8, Publisher: IEEE, Published in: US.

(Continued)

*Primary Examiner* — Elias Desta
(74) *Attorney, Agent, or Firm* — Fogg & Powers LLC (57) ABSTRACT

Systems and methods for off-line and on-line sensor calibration are provided. In certain embodiments, a method for calibrating a sensor comprises receiving at least one reference measurement describing a system state for a system; and receiving at least one sensor measurement from the sensor, wherein the at least one sensor measurement is acquired from an observation of the environment of the system by the sensor. The method also comprises calculating a model residual power spectral density based on the at least one reference measurement and a sensor measurement model; and calculating a measurement residual power spectral density based on the at least one sensor measurement and the at least one reference measurement. Further, the method comprises identifying sensor parameters that morph the model residual power spectral density towards the measurement residual power spectral density.

19 Claims, 3 Drawing Sheets

(56) References Cited

OTHER PUBLICATIONS

Yun et al., "Estimation of Human Foot Motion During Normal Walking Using Inertial and Magnetic Sensor Measurements", "IEEE Transactions on Instrumentation and Measurement", Jun. 5, 2012, pp. 2059-2072, vol. 61, No. 7, Publisher: IEEE, Published in: US.

Bageshwar et al., "Inertially-Aided Vector Matching Algorithm for Attitude Determination of Spin Stabilized Satellites", "AIAA Guidance, Navigation and Control Conference and Exhibit", 2008, pp. 1-25.

Georgiou, "Distances and Riemannian Metrics for Spectral Density Functions", "IEEE Transactions on Signal Processing", Aug. 2007, pp. 3995-4003, vol. 55, No. 8, Publisher: IEEE.

Jiang et al., "Distances and Riemannian Metrics for Multivariate Spectral Densities", "IEEE Transactions on Automatic Control", Jul. 2012, pp. 1723-1735, vol. 57, No. 7, Publisher: IEEE.

Jwo et al., "Adaptive Fuzzy Strong Tracking Extended Kalman Filtering for GPS Navigation", "IEEE Sensors Journal", May 2007, pp. 778-789, vol. 7, No. 5.

Jwo et al., "An Adaptive Sensor Fusion Method with Applications in Integrated Navigation", "Proceedings of the 17th World Congress The International Federation of Automatic Control", Jul. 6-11, 2008, pp. 9002-9007, Publisher: IFAC, Published in: KR.

Ljung, "System Identification", "The Control Handbook", 1996, pp. 1033-1054, Publisher: CRC Press, Inc.

Soken et al., "A Novel Adaptive Unscented Kalman Filter for PICO Satellite Attitude Estimation", "PHYSCON 2011", Sep. 5-8, 2011, pp. 1-7, Published in: ES.

Stoica et al., "Spectral Analysis of Signals", 2005, Page(s) i-427, Publisher: Prentice Hall, Inc., Published in: US.

Trinh et al., "A General Approach to Online Sensor Calibration for Navigation Using Factor Graphs", "Proceedings of the 2013 International Technical Meeting of The Institute of Navigation", Jan. 2013, pp. 1-8, Publisher: SRI International Sarnoff, Published in: US.

* cited by examiner

SYSTEMS AND METHODS FOR OFF-LINE AND ON-LINE SENSOR CALIBRATION

BACKGROUND

Multiple applications rely on the knowledge of a vehicle's kinematic state vector, where the kinematic state vector describes the position, velocity, attitude, and angular velocity of the vehicle. In certain implementations, to estimate the kinematic state vector, a navigation system blends measurements from sets of sensors using filter architectures. Frequently, these filter architectures rely on sensor measurement models that compensate for the effect of sensor measurement errors on the sensor measurements and estimated kinematic state vector. During the operation of the sensor, the accuracy of the sensor measurement models can be affected by sources that include sensor calibration errors, temperature variations, vibrations, and the like. Inaccurately modeled sensor measurement errors in the sensor measurement models may cause a mismatch between the actual and modeled sensor and system performance. The mismatch between actual and modeled sensor and system performance may reduce navigation accuracy and measurement integrity.

SUMMARY

Systems and methods for off-line and on-line sensor calibration are provided. In certain embodiments, a method for calibrating a sensor comprises receiving at least one reference measurement describing a system state for a system; and receiving at least one sensor measurement from the sensor, wherein the at least one sensor measurement is acquired from an observation of the environment of the system by the sensor. The method also comprises calculating a model residual power spectral density based on the at least one reference measurement and a sensor measurement model; and calculating a measurement residual power spectral density based on the at least one sensor measurement and the at least one reference measurement. Further, the method comprises identifying sensor parameters that morph the model residual power spectral density towards the measurement residual power spectral density.

DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

Embodiments described in the present disclosure provide systems and methods for the off-line and on-line calibration of sensors. To perform the on-line and off-line calibration, a system calculates a measurement residual from reference measurements and sensor measurements. The system may also calculate a model residual from the output of the sensor measurement model and the sensor measurements. When the measurement residual and the model residual are calculated, the system calculates the power spectral densities (PSDs) of both the measurement and model residuals. The system then iteratively adjusts the sensor measurement model such that the PSDs of the measurement and model residuals become sufficiently close to one another. In at least one implementation, the sensor measurement model is adjusted such that geodesic distance between the measurement and model residual PSDs are reduced. The adjustment of the sensor measurement models as described above and below may be used to calibrate a sensor when it is either on-line or off-line.

Figure 1:
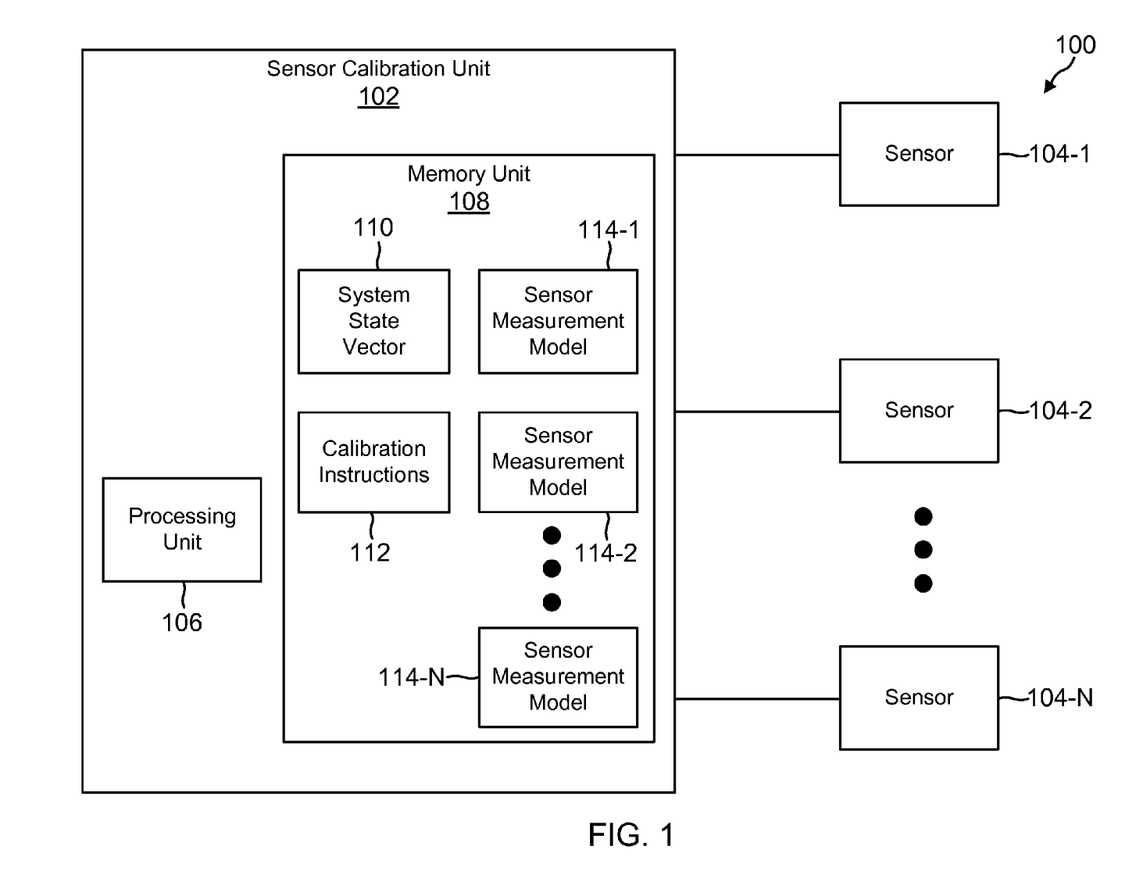
FIG. 1 is a block diagram of a system for calibrating sensors in one embodiment described in the present disclosure.

FIG. 1, is block diagram of a system 100 that calibrates sensors 104-1-104-N both in off-line and on-line operative modes. As used here, the phrase "on-line" refers to an operative mode where the sensors 104-1-104-N are providing measurements during normal operation. In contrast, the phrase "off-line" refers to an operative mode where the sensors 104-1-104-N provide measurements when the system is not in normal operation. For example, where the system is a navigation system located on an aircraft, the on-line operative mode would include when the aircraft is flying, taxiing, or when the navigation system is generally in use. In contrast, for example, the off-line operative mode would include factory calibration, where the sensors 104-1-104-N are being calibrated or tested. To control the calibration of the sensors 104-1-104-N, the sensors 104-1-104-N communicate with a sensor calibration unit 102. The sensor calibration unit 102 receives data from the sensors 104-1-104-N and processes the information to accurately determine the current state of the system 100.

In certain embodiments, the sensor calibration unit 102 includes a processing unit 106 and a memory unit 108. The processing unit 106 receives data from the sensors 104-1-104-N and executes instructions that direct the processing unit 106 to determine the current state of the system 100. For example, when system 100 is a navigation system, the processing unit 106 is able to determine the kinematic state vector of the navigation system based on the information received from the sensors 104-1-104-N. The different functions performed by the processing unit 106 are described in greater detail below. Further, the processing unit 106 may be implemented through digital computer systems, microprocessors, general purpose computers, programmable controllers and field programmable gate arrays (FPGAs) or application-specific integrated circuits (ASICs). The processing unit 106 executes program instructions that are resident on computer readable media such as memory unit 108, which, when executed by the processing unit 106, cause the processing unit 106 to implement embodiments described in the present disclosure. Computer readable media include any form of a physical computer memory storage device. Examples of such a physical computer memory device include, but are not limited to, punch cards, magnetic disks or tapes, optical data storage systems, flash read only memory (ROM), non-volatile ROM, programmable ROM (PROM), erasable-programmable ROM (E-PROM), random access memory (RAM), or any other form of permanent, semi-permanent, or temporary memory storage system or device. Program instructions include, but are not limited to computer-executable instructions executed by computer system processors and hardware description languages such as Very High Speed Integrated Circuit (VHSIC) Hardware Description Language (VHDL).

In certain implementations, to facilitate the execution of the processing unit 106, the memory unit 108 stores data related to the system state vector 110. The system state vector 110 is data that describes the current state of the system 100. For example, when the system 100 is a navigation system, the system state vector 110 contains data related to the current kinematic state vector of the navigation system. For example, the system state vector 110 may store the position, velocity, attitude, and angular velocity of a vehicle to which the sensors 104-1-104-N are attached. Further, the memory unit 108 stores data related to a separate sensor measurement model 114-1-114-N for each sensor 104-1-104-N.

As described herein, when the processing unit 106 processes a sensor measurement model, the processing unit 106 blends measurements from the sensors 104-1-104-N using a filter architecture to combine the measurements from the sensors 104-1-104-N to estimate the statistics of the system state vector 110. For example, when the system 100 is a navigation system, the filter architecture uses the sensor measurement models 114-1-114-N and directs the processing unit 106 to combine the measurements from the sensors 104-1-104-N to estimate a kinematic state vector for a vehicle. As described herein, the filter architecture may use either all available or a subset of the available sensor measurements to compute estimates of the statistics of the system state vector 110. The performance and the stability of the filter architecture depends on the ability of the sensor measurement models 114-1-114-N to correctly capture the performance of the sensors 104-1-104-N.

In certain implementations, sensor measurement models 114-1-114-N relate the true measurement to the actual measurement from the sensors 104-1-104-N. As used herein, the true measurement refers to the true state of system in terms of the measured quality and the actual measurement refers to the measurement returned by a sensor. The true measurement is different from the actual measurement because sensors 104-1-104-N corrupt the true measurement through a number of error sources. These error sources can be broadly classified as either deterministic components or stochastic components. The sensor measurement models 114-1-114-N capture the effect of error sources on the true measurement by selecting error components that model the output of the sensors 104-1-104-N and parameters that characterize the effect of these error components. These parameters, stored in the sensor metadata, may be populated either directly from a sensor calibration procedure or a sensor specification sheet.

In certain implementations, the filter architecture incorporates the sensor measurement models 114-1-114-N as uncertainty in the stochastic system or as a sensor specific state vector estimated by a filter either locally or globally depending on the architecture's hierarchal design. The filter architecture uses the sensor specific state vector to correct the corresponding sensor measurement, system state vector 110, and compute unbiased, minimum variances estimates of the system state vector 110. However, the parameters of the sensor measurement models 114-1-114-N may produce measurements that differ from the true measurements due to errors in the sensor measurement models 114-1-114-N. Off-line error sources such as calibration errors can lead to incorrect parameters stored in the sensor metadata. On-line conditions such as temperature variations, mechanical vibrations, or misalignment of sensor measurement axes from their intended mounting orientation can lead to variations in the parameters over time by causing errors such as bias and noise. As a result, the filter architecture may use incorrect sensor measurement models 114-1-114-N that fail to capture the performance of the sensor, incorrectly capture sensor measurement uncertainty, and incorrectly weigh measurement quality relative to other sensor measurements. This mismatch between the actual sensor performance and modeled sensor performance leads to biased estimates of the sensor specific state vector for the sensors 104-1-104-N and the system state vector 110.

In at least one embodiment, to correct calibration errors and operational variations and errors that arise over time, the memory unit 108 includes calibration instructions 112. For example, when the sensors 104-1-104-N are in an off-line operative mode, the calibration instructions 112 may instruct the processing unit 106 to perform an initial calibration of the sensors 104-1-104-N. Further, when the processing unit 106 executes the calibration instructions 112 when the sensors 104-1-104-N are operational or on-line, the processing unit 106 is able to calibrate the sensors 104-1-104-N during normal operation.

In certain embodiments, to calibrate the sensors 104-1-104-N, the calibration instructions 112 direct the processing unit 106 to perform a sensor off-line and on-line calibration and monitoring (SOLCAM) algorithm. When performing the SOLCAM algorithm, the processing unit 106 generates and compares the PSDs of two residuals for the same sensor computed from three different sources. The three different sources include a reference measurement that is either a true measurement or a measurement generated by the system state vector 110, a sensor measurement generated by a sensor 104 in the sensors 104-1-104-N, and a measurement produced by the associated sensor measurement model 114 in the sensor measurement models 114-1-114-N. When the PSDs are computed, the sensor measurement model parameters are varied to reduce the geodesic distance between the different PSDs. The calculation of the PSDs is described in greater detail below. The sensor measurement model that reduces the geodesic distance better captures the actual sensor performance. Further, the geodesic distance between the different residuals is further reduced along the geodesic path until the geodesic distance between the different residuals is substantially close.

Figure 2:
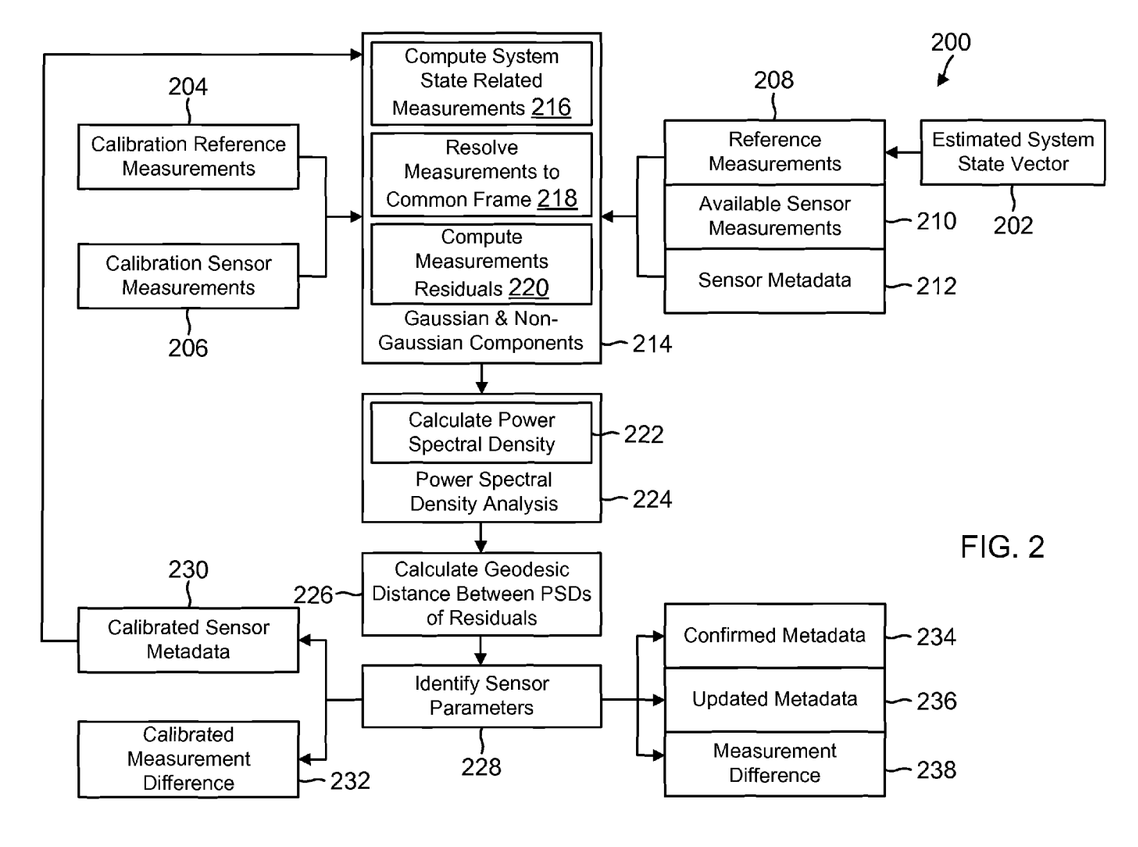
FIG. 2 is a flow diagram illustrating a sensor calibration algorithm in one embodiment described in the present disclosure.

FIG. 2 is a flow diagram that illustrates a SOLCAM algorithm 200 and how the SOLCAM algorithm 200 calibrates sensor measurement models. As shown in FIG. 2, the SOLCAM algorithm 200 may be composed of four parts. In at least one implementation, the four parts of the SOLCAM algorithm are performed by the processing unit 106 as instructed by the calibration instructions 112, described above in relation to FIG. 1. In one of the parts, the SOLCAM algorithm 200 proceeds at 214 where Gaussian and non-Gaussian components of the sensor measurement models are calculated. In certain embodiments, to calculate the Gaussian and non-Gaussian components, the SOLCAM algorithm 200 processes incoming data that depends on whether the sensor being calibrated by the SOLCAM algorithm 200 is in an off-line or an on-line mode. In certain implementations, when performing off-line sensor calibration, the initial conditions for the sensor model parameters are selected from the type and grade of the sensor; when performing on-line sensor monitoring applications, the initial conditions are selected from the sensor meta data.

In certain implementations, when the system is in an off-line mode, the SOLCAM algorithm 200 receives calibration reference measurements 204 and calibration sensor measurements 206 as inputs. To provide the calibration reference measurements 204, the sensor is placed on a calibration machine that performs user-defined maneuvers or given user-defined input. These maneuvers or inputs are the true measurements. In at least one implementation, the calibration sensor measurements 206 may include the actual measurements produced by the sensors. As the sensors are being calibrated, the SOLCAM algorithm 200 is designed to create a sensor measurement model that adjusts the calibration sensor measurements 206 such that the sensor measurement model produces substantially the same measurements as the calibration reference measurements 204. As the sensor measurement model is created, the adjusted sensor measurements are included as an input in the calibration process.

In at least one embodiment, when the system is in an on-line mode, the SOLCAM algorithm 200 receives reference measurements 208, available sensor measurements 210, and sensor metadata 212. As the system is in an on-line mode, the reference measurements 208 are not able to provide the true measurements as described above in regards to the calibration reference measurements 204. In contrast to the calibration reference measurement 204, the reference measurements 208 may be provided by the estimated system state vector 202 that is based on previously calibrated sensor measurements. In the example where the system is a navigation system, the estimated system state vector 202 is an estimated kinematic state vector. For example, when the SOLCAM algorithm 200 calibrates the sensor measurement model the estimated system state vector 202 that is produced by the current sensor measurement model is used in a subsequent calibration of the sensor measurement model based on newly acquired sensor measurements. The sensor measurements 210 may include the non-adjusted measurements provided by the sensors and the sensor metadata 212 may include the modeled sensor parameters, where the sensor parameters are the parameters before they have been adjusted by a calibration performed using the current measurements.

When the processing unit executing the SOLCAM algorithm 200 has received the required measurements, the SOLCAM algorithm 200 proceeds to calculating the Gaussian and non Gaussian components of the sensor measurement model by computing system state related measurements (block 216). To compute the system state related measurements, the processing unit receives the raw data from the various above described measurement sources and calculates a separate system state for each source of received measurements. For example, when calibrating in an on-line mode, a system state is calculated for each of the reference measurements 208, the sensor measurements 210, and the sensor measurement model using the sensor metadata 212. Conversely, when calibrating in an off-line mode, the system state is initially calculated for each of the calibration reference measurements 204, the calibration sensor measurements 206, and for a sensor measurement model as the calibration process determines the sensor measurement model parameters in later iterations of the SOLCAM algorithm 200. When the different system states are calculated for the different measurement sources, the SOLCAM algorithm 200 proceeds to block 218 by resolving the measurements to a common frame. For example, the different system states produced by the different measurements may provide the state of the system resolved in different frames. The SOLCAM algorithm 200 adjusts the different system states such that the different system states are resolved in the same system frame.

When the different measurements have been resolved to a common frame, the SOLCAM algorithm 200 proceeds to block 220, where measurement residuals are computed. In computing measurement residuals, the SOLCAM algorithm 200 calculates two separate residuals. When the SOLCAM algorithm 200 is performing a calibration, the SOLCAM algorithm 200 computes a measurement residual using reference measurement 208 and the sensor measurement 210 as shown in the following equation:

$$\delta z_{meas} = z_{ref} - z_{meas} \quad (1)$$

where $z_{ref}$ refers to the reference measurement 208, $z_{meas}$ refers to the sensor measurement 210, and $\delta z_{meas}$ refers to the measurement residual. The SOLCAM algorithm 200 also computes a model residual using the sensor measurement 210 and the sensor measurement model with sensor parameters stored in the metadata 212 as shown in the following equation:

$$\delta_{model} = z_{meas} - z_{model} \quad (2)$$

where $z_{model}$ refers to the sensor measurement created from the sensor measurement model and $\delta z_{model}$ refers to a model residual. The model residual and the measurement residual identify the effects of errors on the sensor measurements.

When the model residual and the measurement residual are both calculated, the SOLCAM algorithm 200 proceeds to block 224, where the PSDs of the residuals are analyzed. As used herein, a PSD is the Fourier transform of a signal's autocovariance sequence (ACS). A PSD describes the spectral content of the ACS or, more specifically, the distribution of average power over frequency of the signal's ACS. The advantages of using PSDs and the frequency domain to estimate the sensor model parameters are that the realizations of the stochastic error components expressed as a discrete-time sequence have finite average power; the statistics of the stochastic error components are not required to have Gaussian PDFs; multiple statistics of the stochastic error components can be estimated simultaneously; and the statistics of the stochastic error components are analytic in the frequency domain. Further, the PSD of a white noise process is $\Phi_{WN}(j\omega) = \sigma_{WN}^2$ where $\sigma_{WN}$ refers to the standard deviation of the process and the PSD of a first-order Gauss Markov process is $\Phi(j\omega) = 2\sigma_{GM}^2 \tau^{-2}/(\omega^2 + \tau^{-2})$ where $\tau$ refers to the process correlation time constant and $\sigma_{GM}$ refers to the process variation.

To analyze the PSDs, the SOLCAM algorithm 200 proceeds at 222 where a PSD is calculated for both the model residual and the measurement residual. In at least one implementation, when computing the PSD, the SOLCAM algorithm 200 uses a non-parametric Welch PSD estimator. As is known to one having skill in the art, a Welch PSD estimator is an extension of a periodogram spectral estimator. Periodogram spectral estimators have two limitations that result in poor statistical qualities of the estimated PSD. First, the ACS is inaccurate for large lags. Second, the covariance estimation errors accumulate during the computation of the PSD. A Welch PSD estimator is a form of a Blackman-Tukey PSD estimator that smoothes the PSD estimate using a weighting function that reduces the influence of large lags and that reduces the covariance of the PSD estimate by averaging periodograms over subsets of overlapping samples. Welch PSD estimates can be computed in real-time using fast Fourier transforms. The estimates of the two residual PSDs can be written as $\hat{\Phi}_{meas}(\theta)$ for the measurement residual $\delta z_{meas}$ and $\hat{\Phi}_{model}(\theta)$ for the model residual $\delta z_{model}$ where $\theta=[-\pi,\pi]$ radians.

When the measurement residual PSD $\hat{\Phi}_{meas}(\theta)$ and the model residual PSD $\hat{\Phi}_{model}(\theta)$ are calculated, the SOLCAM algorithm 200 proceeds at 226, where the geodesic distance between residual PSDs is calculated. For example, the processing unit 106 calculates the geodesic distance as $\|\hat{\Phi}_{meas}(\theta)/\hat{\Phi}_{model}(\theta)\|_G$, where $\|\cdot\|_G$ refers to the geodesic distance between PSDs. In at least one implementation, the processing unit 106 calculates the geodesic distance between the measurement residual PSD $\hat{\Phi}_{meas}(\theta)$ and the model residual PSD $\hat{\Phi}_{model}(\theta)$ using the following equation:

$$\|\hat{\Phi}_{meas}(\theta)/\hat{\Phi}_{model}(\theta)\|_G = \left[\int_{-\pi}^{\pi}\left(\log\frac{\hat{\Phi}_{meas}(\theta)}{\hat{\Phi}_{model}(\theta)}\right)^2\frac{d\theta}{2\pi} - \left(\int_{-\pi}^{\pi}\log\frac{\hat{\Phi}_{meas}(\theta)}{\hat{\Phi}_{model}(\theta)}\frac{d\theta}{2\pi}\right)^2\right]^{1/2} \quad (3)$$

where the geodesic distance $\|\cdot\|_G$ is the ratio of arithmetic and geometric means. As described herein, the geodesic distance $\|\cdot\|_G$ provides a measure of whether the current sensor parameters capture the actual sensor performance. A large geodesic distance $\|\cdot\|_G$ indicates that there is a large difference between the actual and modeled sensor performance and that the sensor measurement model, represented by parameters stored in the sensor metadata 212, does not accurately capture the effect of the sensor error components. A small $\|\cdot\|_G$ indicates that there is a small difference between the actual and modeled sensor performance, thus, the sensor measurement model and the parameters stored in the sensor metadata 212 accurately capture the effect of the sensor error components.

When the geodesic distance is calculated, the SOLCAM algorithm 200 proceeds at 228, where the SOLCAM algorithm 200 identifies sensor parameters. Initially, the SOLCAM algorithm 200 selects different sensor parameters depending on whether the SOLCAM algorithm 200 is performing an on-line or an off-line calibration. For example, when the SOLCAM algorithm 200 is performing an off-line calibration, the SOLCAM algorithm 200 initially selects sensor parameters for the sensor measurement model. In subsequent iterations of the SOLCAM algorithm 200, the SOLCAM algorithm 200 updates the sensor parameters. The initial sensor parameters and resulting sensor measurement model account for error components in the calibration sensor measurements 206. Once the sensor parameters are created and stored in the sensor metadata 230, the sensor parameters stored in the sensor metadata 230 are provided as an input to the Gaussian and non-Gaussian components 214 in subsequent iterations of the SOLCAM algorithm 200 when performing the off-line calibration. Further, the SOLCAM algorithm 200 provides calibration measurement difference 232, where the calibration measurement difference 232 provides the errors between the calibration sensor measurements 206 and the calibration reference measurements 204. In at least one implementation, the size of the calibration measurement difference 232 may be compared against a threshold to determine if the calibrated sensor parameters stored in the sensor metadata 230 are sufficiently accurate. For example, the calibration measurement difference 232 may be compared against a threshold to determine if the calibration sensor measurements 206 correspond to the calibration reference measurements 204.

When the SOLCAM algorithm 200 performs an on-line calibration, the SOLCAM algorithm 200 may provide different outputs. In at least one implementation, the SOLCAM algorithm 200 provides an indication as to whether the sensor parameters stored in the sensor metadata 212, provided as an input to the SOLCAM algorithm 200, were sufficiently accurate. If the sensor parameters stored in the sensor metadata 212 were sufficiently accurate, the SOLCAM algorithm 200 provides confirmed metadata 234, where the confirmed metadata 234 confirms that the sensor parameters stored in the metadata 212 sufficiently captured the error components in the available sensor measurements 210. If the sensor parameters stored in the metadata 212 are not sufficiently accurate, the SOLCAM algorithm 200 provides updated metadata 236, where the updated metadata 236 are adjusted parameters for the available sensors, where the parameters are adjusted to more accurately capture the error components in the available sensor measurements 210. Further, the SOLCAM algorithm 200 may provide a measurement difference 238 between the sensor measurements 210 and the reference measurements 208, where the measurement difference 238 functions similarly to the calibration measurement difference 232.

In at least one implementation, when identifying sensor parameters to provide either as a new sensor measurement model, as in the case of off-line calibration, or as an update to a received sensor measurement model, the SOLCAM algorithm 200 reduces the geodesic distance between the measurement residual PSD and the model residual PSD by identifying sensor parameters that result in a smaller geodesic distance between the measurement residual PSD and the model residual PSD. In at least one implementation, the SOLCAM algorithm 200 identifies a finite set of sensor parameters that yield a smallest geodesic distance between the measurement residual PSD and the model residual PSD as illustrated by the following equation:

$$\min_{\substack{sensor \\ parameters}} J = \|\hat{\Phi}_{meas}(\theta)/\hat{\Phi}_{model}(\theta)\|_G \quad J \in R \quad (4)$$

To solve the above problem, the SOLCAM algorithm 200 may select and vary sensor parameters that morph the model residual PSD to the measurement residual PSD until the geodesic distance $\|\cdot\|_G$ between the morphed model residual PSD and measurement residual PSD is reduced below a threshold geodesic distance. Further, the morphing of the model residual PSD to the measurement residual PSD may be constrained to follow the geodesic path between the two PSDs. The geodesic path between the measurement residual PSD and the model residual PSD can be stated as follows:

$$\hat{\Phi}_\tau = \hat{\Phi}_{model}^{1/2}(\hat{\Phi}_{model}^{-1/2}\hat{\Phi}_{meas}\hat{\Phi}_{model}^{-1/2})^\tau \hat{\Phi}_{model}^{1/2}$$
$$2\forall \tau \in [0,1] \quad (5)$$

By following a geodesic path, the set of morphed PSDs form a convex set and each PSD along the path of the interpolated PSDs is stable. Thus, the morphing of the model residual PSD results in stable identified sensor parameters.

The sensor parameters are then iteratively used as inputs in equation (4) until the model residual PSD is sufficiently equal to the measurement residual PSD. For example, when the geodesic distance is less than a distance threshold, the SOLCAM algorithm 200 uses the sensor parameters stored in the sensor metadata 212 that produced the calculated geodesic distance in the sensor measurement model for the associated sensor that produced the sensor measurements 210. In at least one implementation, the SOLCAM algorithm 200 is performed when sensor measurements are received. Alternatively, the SOLCAM algorithm 200 may be periodically executed according to a schedule.

Figure 3:
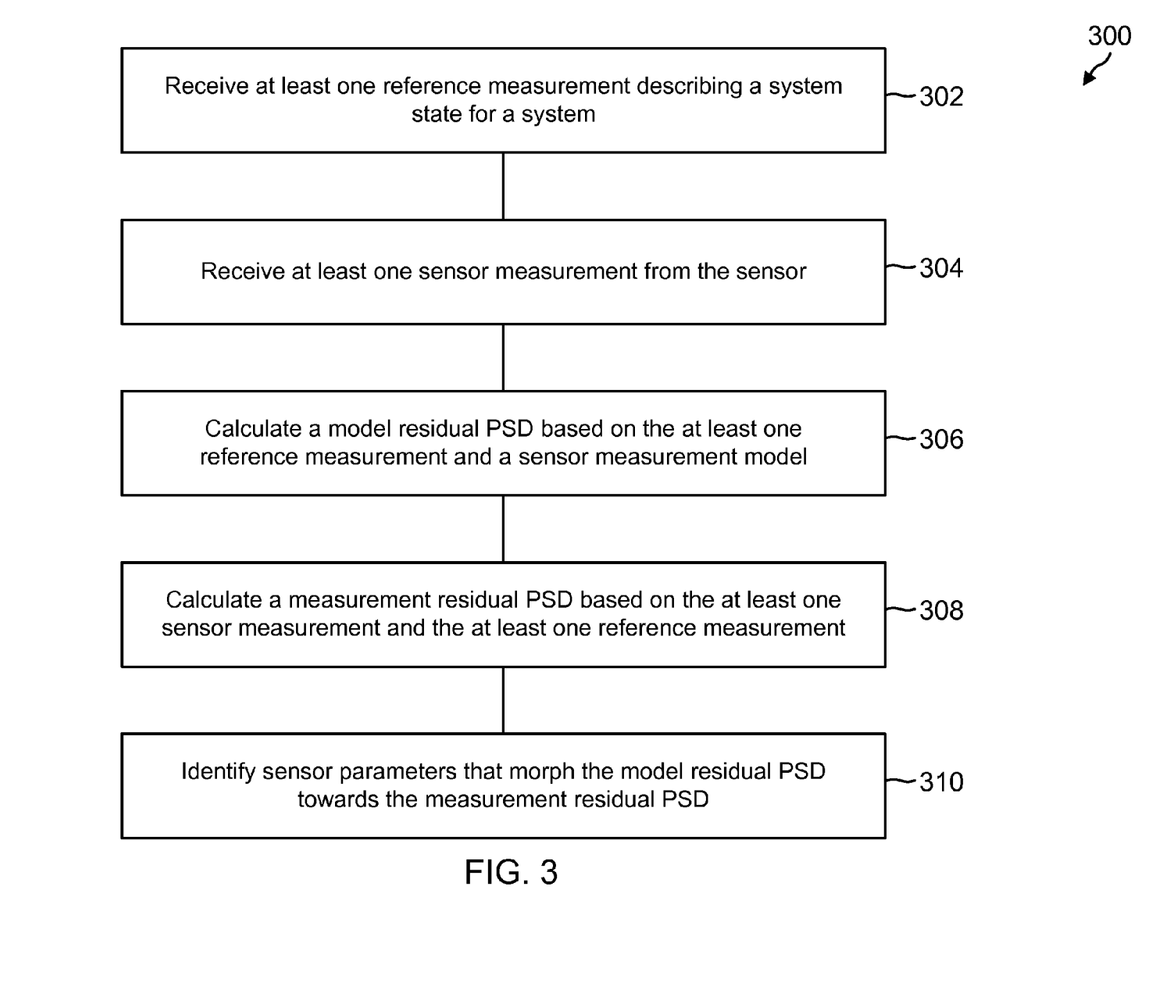
FIG. 3 is a flow diagram of a method for sensor calibration in one embodiment described in the present disclosure.

FIG. 3 is a flow diagram illustrating a method 300 for calibrating sensors according to one embodiment of the present disclosure. Method 300 proceeds at 302, where at least one reference measurement describing a system state for a system is received. As described above, the sensors can be calibrated when a system is both operating in an on-line mode or an off-line mode. When the system is operating in an off-line mode, the sensors may be calibrated using data provided by a user that represents true measurements that are known to be accurate. When the system is operating in an on-line mode, the sensors may be calibrated using a system state vector that was calculated using previously calibrated data. The reference measurements provide a measurement against which actual sensor measurements may be compared. As such, method 300 proceeds at 304, where at least one sensor measurement is received from the sensor. As part of the sensor measurement received from the sensor, when the sensor is in an on-line mode, a model measurement from a sensor measurement model may also be created. To create the model measurement, the sensor measurement model adjusts the sensor measurements to compensate for errors that may occur during operation as described above.

Further, method 300 proceeds at 306, where a model residual PSD is calculated based on the at least one reference measurement and a sensor measurement model. When the sensor is initially functioning in the off-line operative mode, the sensor parameters of the sensor measurement model may not exist. The initial model measurement is created the same way as the subsequent model measurements; the difference being that the initial parameters may be arbitrarily selected. When the sensor is functioning in the on-line operative mode, or after a sensor measurement model has been created in the off-line operative mode, the model residual PSD is calculated based on the model measurement created from the parameters stored in the sensor metadata and the sensor measurement. In certain implementations, method 300 proceeds at 308, where a measurement residual PSD is calculated based on the at least one sensor measurement and the at least one reference measurement. For example, the measurement residual PSD may be a function of the difference between the sensor measurements and the reference measurements.

In certain implementations, method 300 proceeds at 310, where sensor parameters are identified that morph the model residual PSD towards the measurement residual PSD. For example, a calibration system may morph the model residual PSD towards the measurement residual PSD by iteratively adjusting the sensor parameters in the sensor measurement model. In certain embodiments, when adjusting the sensor parameters, the model residual PSD is morphed along the geodesic path between the model residual PSD and the measurement residual PSD until the geodesic distance between the model residual PSD and the measurement residual PSD is below a threshold value, or until the model residual PSD and the measurement residual PSD are sufficiently equal. When the geodesic distance is below a threshold value, the sensor parameters associated with the model residual PSD are then used to correct sensor measurements, as such the produced sensor parameters are stored in the sensor metadata for subsequent use.

EXAMPLE EMBODIMENTS

Example 1 includes a system, the system comprising: at least one sensor configured to acquire at least one sensor measurement that describes a state of the system; and a sensor calibration unit configured to receive the at least one sensor measurement from the at least one sensor and calibrate the at least one sensor, wherein the sensor calibration unit comprises a processing unit, wherein computer readable instructions direct the processing unit to: acquire at least one reference measurement, wherein the at least one reference measurement describes the state of the system; calculate a model residual based on the at least one sensor measurement and the sensor measurement model; calculate a measurement residual based on the at least one reference measurement and the at least one sensor measurement; calculate a model residual power spectral density; calculate a measurement residual power spectral density; and identify sensor parameters for the sensor measurement model based on morphing the model residual power spectral density towards the measurement residual power spectral density, wherein the sensor measurement model compensates for errors in the at least one sensor measurement by adjusting the sensor parameters of the sensor measurement model.

Example 2 includes the system of Example 1, wherein the model residual is based on the difference between the at least one sensor measurement and at least one model measurement produced by applying the sensor measurement model to the sensor measurement.

Example 3 includes the system of any of Examples 1-2, wherein the model residual power spectral density is morphed to the measurement residual power spectral density along a geodesic path.

Example 4 includes the system of any of Examples 1-3, wherein the identified sensor parameters reduce a geodesic distance between the model residual power spectral density and the measurement residual power spectral density.

Example 5 includes the system of Example 4, wherein new sensor parameters are iteratively identified until the geodesic distance between the model residual power spectral density and the measurement residual power spectral density is less than a distance threshold.

Example 6 includes the system of any of Examples 1-5, wherein the at least one reference measurement comprises at least one of: an estimated system state vector; and at least one true measurement representing the true state of the system.

Example 7 includes the system of Example 6, wherein the at least one true measurement is provided to the sensor calibration unit by at least one of a reference unit and a user.

Example 8 includes the system of any of Examples 6-7, wherein the estimated system state vector is a kinematic state vector of the system.

Example 9 includes the system of any of Examples 1-8, wherein the system is a navigation system.

Example 10 includes the system of any of Examples 1-9, wherein the model residual power spectral density and the measurement residual power spectral density are calculated using a non-parametric estimator.

Example 11 includes a method for calibrating a sensor, the method comprising: receiving at least one reference measurement describing a system state for a system; receiving at least one sensor measurement from the sensor, wherein the at least one sensor measurement is acquired from an observation of the environment of the system by the sensor; calculating a model residual power spectral density based on the at least one reference measurement and a sensor measurement model; calculating a measurement residual power spectral density based on the at least one sensor measurement and the at least one reference measurement; identifying sensor parameters that morph the model residual power spectral density towards the measurement residual power spectral density.

Example 12 includes the method of Example 11, wherein the model residual is based on the difference between the at least one sensor measurement and at least one model measurement produced by applying the sensor measurement model to the sensor measurement.

Example 13 includes the method of any of Examples 11-12, wherein identifying sensor parameters comprises identifying sensor parameters along the geodesic path between the model residual power spectral density and the measurement residual power spectral density.

Example 14 includes the method of Example 13, wherein new sensor parameters are iteratively identified until the geodesic distance between the model residual power spectral density and the measurement residual power spectral density is less than a distance threshold.

Example 15 includes the method of Example 14, wherein the new sensor parameters define the sensor measurement model.

Example 16 includes the method of any of Examples 11-15, further comprising resolving the at least one reference measurement and the at least one sensor measurement to a common frame.

Example 17 includes the method of any of Examples 11-16, wherein the at least one reference measurement comprises at least one of: an estimated system state vector; and at least one true measurement representing the true state of the system.

Example 18 includes the method of any of Examples 11-17, wherein the model residual power spectral density and the measurement residual power spectral density are calculated using a non-parametric estimator.

Example 19 includes a navigation system, the navigation system comprising: at least one sensor configured to acquire navigation data for the navigation system; and a sensor calibration unit configured to receive the sensor measurements from the at least one sensor and calibrate the at least one sensor, wherein the sensor calibration unit comprises a processing unit, wherein computer readable instructions direct the processing unit to: acquire a reference measurement, wherein the reference measurement describes a navigation state of the system; calculate a model residual based on the sensor measurements and a sensor measurement model; calculate a measurement residual based on the reference measurement and the sensor measurement; calculate a model residual power spectral density; calculate a measurement residual power spectral density; and identify sensor parameters for the sensor measurement model based on reducing the geodesic distance between the model residual power spectral density and the measurement residual power spectral density, wherein the sensor measurement model compensates for errors in the sensor measurement by adjusting the parameters of the measurement model.

Example 20 includes the navigation system of Example 19, wherein the model residual is based on the difference between the at least one sensor measurement and at least one model measurement produced by applying the sensor measurement model to the sensor measurement.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

What is claimed is:

1. A system, the system comprising:
    at least one sensor configured to acquire sensor measurements over time that describes a kinematic state of the system; and
    a sensor calibration unit configured to receive the sensor measurements from the at least one sensor and calibrate the at least one sensor, wherein the sensor calibration unit comprises a processing unit, wherein computer readable instructions direct the processing unit to:
        acquire reference measurements over time, wherein the reference measurements describe the kinematic state of the system;
        calculate a model residual based on the sensor measurements and a sensor measurement model;
        calculate a measurement residual based on the reference measurements and the sensor measurements;
        calculate a power spectral density of the model residual;
        calculate a power spectral density of the measurement residual; and
        identify sensor parameters for the sensor measurement model based on morphing the power spectral density of the model residual towards the power spectral density of the measurement residual, wherein the sensor measurement model compensates for errors in the sensor measurements by adjusting the sensor parameters of the sensor measurement model.

2. The system of claim 1, wherein the model residual is based on the difference between the sensor measurements and model measurements produced by applying the sensor measurement model to the sensor measurements.

3. The system of claim 1, wherein the power spectral density of the model residual is morphed to the power spectral density of the measurement residual along a geodesic path.

4. The system of claim 1, wherein the identified sensor parameters reduce a geodesic distance between the power spectral density of the model residual and the power spectral density of the measurement residual.

5. The system of claim 4, wherein new sensor parameters are iteratively identified until the geodesic distance between the power spectral density of the model residual and the power spectral density of the measurement residual is less than a di stance threshold.

6. The system of claim 1, wherein the reference measurement comprises at least one of:
    an estimated system kinematic state vector; and
    at least one true measurement representing the true kinematic state of the system.

7. The system of claim 6, wherein the at least one true measurement is provided to the sensor calibration unit by at least one of a reference unit and a user.

8. The system of claim 1, wherein the system is a navigation system.

9. The system of claim 1, wherein the power spectral density of the model residual and the power spectral density of the measurement residual are calculated using a non-parametric estimator.

10. A method for calibrating a sensor, the method comprising:
receiving reference measurements describing a kinematic state for a system;
receiving sensor measurements from the sensor, wherein the sensor measurements are acquired from an observation of the environment of the system by the sensor;
calculating, with a processing unit, a power spectral density of the model residual based on the reference measurements and a sensor measurement model;
calculating, with the processing unit, a power spectral density of the measurement residual based on the sensor measurements and the at least one reference measurement;
identifying, with the processing unit, sensor parameters that morph the power spectral density of the model residual towards the power spectral density of the measurement residual; and
compensating, with the processing unit, for differences in the power spectral density of the measurement residual and the power spectral density of the model residual by adjusting the parameters of the sensor measurement model.

11. The method of claim 10, wherein the model residual is based on the difference between the sensor measurements and model measurements produced by applying the sensor measurement model to the sensor measurement.

12. The method of claim 10, wherein identifying sensor parameters comprises identifying sensor parameters along the geodesic path between the power spectral density of the model residual and the power spectral density of the measurement residual.

13. The method of claim 12, wherein new sensor parameters are iteratively identified until the geodesic distance between the power spectral density of the model residual and the power spectral density of the measurement residual is less than a distance threshold.

14. The method of claim 13, wherein the new sensor parameters define the sensor measurement model.

15. The method of claim 10, further comprising resolving the reference measurements and the sensor measurements to a common frame.

16. The method of claim 10, wherein the reference measurements comprises at least one of:
an estimated system kinematic state vector; and
at least one true measurement representing the true kinematic state of the system.

17. The method of claim 10, wherein the power spectral density of the model residual and the power spectral density of the measurement residual are calculated using a non-parametric estimator.

18. A navigation system, the navigation system comprising:
at least one sensor configured to acquire navigation data for the navigation system; and
a sensor calibration unit configured to receive the sensor measurements over time from the at least one sensor and calibrate the at least one sensor, wherein the sensor calibration unit comprises a processing unit, wherein computer readable instructions direct the processing unit to:
acquire reference measurements over time, wherein the reference measurements describe a navigation state of the system;
calculate a model residual based on the sensor measurements and a sensor measurement model;
calculate a measurement residual based on the reference measurement and the sensor measurement;
calculate a power spectral density of the model residual;
calculate a power spectral density of the measurement residual; and
identify sensor parameters for the sensor measurement model based on reducing the geodesic distance between the power spectral density of the model residual and the power spectral density of the measurement residual, wherein the sensor measurement model compensates for errors in the sensor measurement by adjusting the parameters of the sensor measurement model.

19. The navigation system of claim 18, wherein the model residual is based on the difference between the sensor measurements and model measurements produced by applying the sensor measurement model to the sensor measurement.

* * * * *